(12) United States Patent
Yi

(10) Patent No.: US 6,884,693 B2
(45) Date of Patent: Apr. 26, 2005

(54) SILICON-ON-INSULATOR WAFER AND METHOD OF MANUFACTURING THE SAME

(75) Inventor: Sang-don Yi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/600,724

(22) Filed: Jun. 20, 2003

(65) Prior Publication Data

US 2004/0004253 A1 Jan. 8, 2004

(30) Foreign Application Priority Data

Jul. 5, 2002 (KR) ........................................ 2002-38892

(51) Int. Cl.$^7$ .............................................. H01L 21/30
(52) U.S. Cl. ........................ 438/406; 438/459; 438/519
(58) Field of Search ............................... 438/455–456, 438/459, 514, 519, 522

(56) References Cited

U.S. PATENT DOCUMENTS

| | | | |
|---|---|---|---|
| 5,496,764 A | * | 3/1996 | Sun ............................ 438/459 |
| 5,789,788 A | * | 8/1998 | Ema et al. ................... 257/371 |
| 6,051,480 A | * | 4/2000 | Moore et al. ................ 438/435 |
| 6,242,320 B1 | | 6/2001 | So ............................... 438/406 |

FOREIGN PATENT DOCUMENTS

| | | | | |
|---|---|---|---|---|
| JP | 4-3910 | | 1/1992 | ........... G01L/21/02 |
| JP | 7-231036 | | 8/1995 | ......... H01L/21/762 |
| JP | 10-223497 | * | 8/1998 | ........... H01L/21/02 |
| JP | 00-183157 | | 6/2000 | ......... H01L/21/762 |

* cited by examiner

*Primary Examiner*—Anh Duy Mai
(74) *Attorney, Agent, or Firm*—Mills & Onello LLP

(57) ABSTRACT

In a silicon-on-insulator (SOI) wafer and a method of manufacturing the same, the SOI wafer includes a first semiconductor wafer including an isolation insulating film formed to define an active region; a well region and a buried layer formed in the active region of the first semiconductor wafer; and a second semiconductor wafer bonded with the first semiconductor wafer, wherein an SOI insulating film, which contacts a lower portion of the isolation insulating film and electrically insulates a lower portion of the active region, is formed.

22 Claims, 5 Drawing Sheets

SILICON-ON-INSULATOR WAFER AND METHOD OF MANUFACTURING THE SAME

BACKGROUND OF THE INVENTION

This application claims the priority of Korean Patent Application No. 2002-38892, filed on Jul. 5, 2002, in the Korean Intellectual Property Office, the disclosure of which is incorporated herein in its entirety by reference.

1. Field of the Invention

The present invention relates to a silicon-on-insulator (SOI) wafer and a method of manufacturing the same, and more particularly, to a silicon-on-insulator (SOI) wafer manufactured using wafer bonding that forms an SOI substrate by bonding two semiconductor wafers, and a method of manufacturing the same.

2. Description of the Related Art

As semiconductor devices to become ever-increasingly more highly integrated, the design rule for forming devices is necessarily reduced, and accordingly, the amount and thickness of insulation between adjacent devices is lowered. Devices that are formed on a semiconductor wafer can be insulated in a lateral direction. However, they cannot be insulated in the area of a bulk region that extends in a lower portion of the semiconductor wafer. Hence, in semiconductor devices, such as power transistors that operate at a higher voltage, or RF devices, punch-through tends to readily occur between devices in these regions. Also, parasitic parameters, such as parasitic resistance and parasitic capacitance in the bulk region are generally problematic.

In order to address these problems, in general, a silicon-on-insulator (SOI) wafer is used in which the bulk region is lowered and in which the lateral direction of the device are blocked by an insulator and the active region is completely electrically isolated from peripheral devices. The SOI wafer is structured such that an insulator and a silicon film are sequentially formed on a silicon substrate. The SOI wafer is manufactured using wafer bonding and using separation by implantation of oxygen (SIMOX).

SIMOX is a technique in which oxygen ions are implanted to a predetermined depth of the semiconductor wafer and a silicon oxide film is formed as an insulating film on an intermediate layer of the semiconductor wafer by high-temperature heat treatment. This method causes serious defects in the wafer in portions where devices are to be formed.

Wafer bonding is a technique in which a silicon insulating film is formed on the surfaces of two semiconductor wafers and bonded with each other. However, this technique of wafer bonding requires two semiconductor wafers for forming one SOI wafer. Also, a well for forming devices must be formed on the SOI wafer, or isolation must be performed. Thus, many defects occur in the semiconductor substrate and manufacturing costs increase.

SUMMARY OF THE INVENTION

The present invention provides a silicon-on-insulator (SOI) wafer that reduces the number of processes and does not require an additional process, such as Epi growth, when a semiconductor device is manufactured using an SOI wafer, and a method of manufacturing the same.

According to an aspect of the present invention, there is provided a silicon-on-insulator (SOI) wafer. The SOI wafer includes a first semiconductor wafer including an isolation insulating film formed to define an active region, a well region and a buried layer formed in the active region of the first semiconductor wafer, and a second semiconductor wafer bonded with the first semiconductor wafer, wherein an SOI insulating film, which contacts a lower portion of the isolation insulating film and electrically insulates a lower portion of the active region, is formed.

Here, the isolation insulating film is a trench-shaped silicon oxide film so that the active region can be deeply formed and a highly-integrated semiconductor device can be easily formed.

The well region and the buried layer are divided into an NMOS region and a PMOS region, respectively, and a P-well is formed in the NMOS region, and an N-well is formed in the PMOS region.

The SOI insulating film is, for example, a silicon oxide film formed on the first semiconductor wafer. Preferably, the SOI insulating film is formed by thermally oxidizing a substrate silicon.

The active region is formed in the first semiconductor wafer, and the second semiconductor wafer is a support wafer that supports the first semiconductor wafer.

According to another aspect of the present invention, there is provided a method of manufacturing an SOI wafer. First, a) a first semiconductor wafer and a second semiconductor wafer are prepared, and a bonding insulating film is formed on a front face of the second semiconductor wafer, and an isolation insulating film is formed on the front face of the first semiconductor wafer to form an active region. Next, b) an ion implantation process is performed so as to form a P-well and an N-well in the active region. Next, c) the respective front face of the first semiconductor wafer and the second semiconductor wafer are pre-bonded. Next, d) the bonded first and second semiconductor wafers are heated at a predetermined temperature to completely bond is the first and second semiconductor wafers with each other. Last, e) substrate silicon on the back face of the first semiconductor wafer is polished to a bottom level of the isolation insulating film.

Here, in a), a mask insulating film is formed on the surface of the first semiconductor wafer, and an isolation trench is formed on the mask insulating film and the first semiconductor wafer. Next, a trench fill insulating film is formed so as to bury the isolation trench. Next, the trench fill insulating film is planarized to a level of the mask insulating film using a planarization process. In this case, the mask insulating film includes a silicon oxide film. The mask insulating film further includes a silicon nitride film.

The trench fill insulating film is a silicon oxide film, and chemical mechanical polishing (CMP) is used in the planarization process so that less damages occurs on the surfaces of the semiconductor wafer and high planarization can thereby be achieved.

In step a), the bonding insulating film is a silicon oxide film so that films can be easily formed and a high adhering force can be achieved during a subsequent wafer bonding process. The bonding insulating film is formed by thermally oxidizing the substrate silicon of the second semiconductor wafer.

In step b), a photoresist having a pattern with which a region in which an N-well is to be formed is opened is formed, and N-type impurities are implanted in the substrate silicon of the first semiconductor wafer using the patterned photoresist as a mask using ion implantation. Next, the photoresist is removed. Next, a photoresist patterned so that a P-well is opened, is formed on the first semiconductor wafer, and P-type impurities are implanted in the substrate silicon of the first semiconductor wafer using ion implantation and the patterned photoresist as a mask. Next, the photoresist is removed.

Here, the order of implantation of the P-type impurities and the N-type impurities may be changed.

In this case, the N-type impurities are 5-valence electron ions, such as phosphor (P), arsenic (As), and antimony (Sb), and the P-type impurities are 3-valence electron ions, such as boron (B) and $BF_2$.

In step c), the first and second semiconductor wafers are arranged so that their front faces face each other, and a force is vertically applied to a back face of a bonded surface of the first and second semiconductor wafers. In this case, certain $H_2O$ vapor is absorbed into the surface on which the first and second semiconductor wafers are bonded with each other so that semiconductor wafers can be easily bonded with each other.

Preferably, step d) is performed at a temperature higher than a temperature at which ions implanted in the N-well and the P-well form a well so that an unnecessary heat treatment process is not performed.

In step e), the back face of the first semiconductor wafer is prepared to be a polishing face, and the substrate silicon on the back face of the first semiconductor wafer is polished using a predetermined polishing process. Here, polishing the substrate silicon comprises grinding the back face of the first semiconductor wafer using a grinder so that back faces of thick semiconductor wafers can be easily removed. Chemical mechanical polishing (CMP) is used in the polishing process so that planarization precision can be improved. In this case, in the planarization process, the isolation insulating film is used as a polishing stopper so that high planarization can be achieved.

After step e), a protection insulating film is formed on a surface of the semiconductor substrate so that a portion in which the substrate silicon of the active region is exposed can be protected from external impurities. In particular, the protection insulating film comprises a silicon oxide film.

According to the present embodiment, an isolation insulting film, a well region, and a buried layer have been already formed when the SOI wafer is manufactured so that the number of processes required for manufacturing the semiconductor device is greatly reduced. As a result, costs needed to manufacture a semiconductor device using the SOI wafer can be reduced.

BRIEF DESCRIPTION OF THE DRAWINGS

The above and other aspects and advantages of the present invention will become more apparent by describing in detail preferred embodiments thereof with reference to the attached drawings in which.

DETAILED DESCRIPTION OF PREFERRED EMBODIMENTS

The present invention will be described more fully with reference to the accompanying drawings in which preferred embodiments of the invention are shown. This invention may, however, be embodied in many different forms and should not be construed as being limited to the embodiments set forth herein. Rather, these embodiments are provided so that this disclosure will be thorough and complete and will fully convey the scope of the invention to those skilled in the art.

Figure 1:
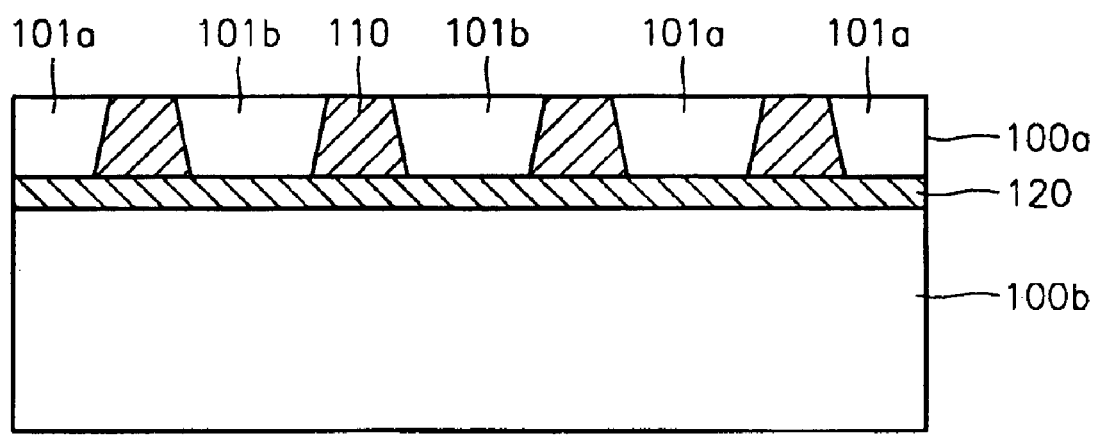
FIG. 1 is a cross-sectional view of a silicon-on-insulator (SOI) wafer according to the present invention.

FIG. 1 is a cross-sectional view of a silicon-on-insulator (SOI) wafer according to the present invention. Referring to FIG. 1, the SOI wafer according to the present invention includes a first semiconductor wafer 100a on which an isolation insulating film 110 for defining an active region is formed, and a second semiconductor wafer 100b, which is bonded with the first semiconductor wafer 100a, on which an SOI insulating film 120 is formed, so as to form an SOI structure.

Here, the isolation insulating film 110 is formed by forming a trench (not shown) having a predetermined depth on the first semiconductor wafer 100a and by filling a silicon insulating film in the trench. In this case, the silicon insulating film comprises a silicon oxide film. The silicon oxide film is formed, for example, using chemical vapor deposition (CVD) and may comprise a silicon oxide film formed by thermally oxidizing a substrate silicon in super-highly-integrated patterns having an extremely narrow width.

Well and buried layers 101a and 101b are formed as a P-well 101a and an N-well 101b, respectively, on a region in which NMOS and PMOS transistors are to be formed. Thus, when semiconductor devices are formed, a well drive-in process or an Epi silicon deposition process for forming buried layers is not necessary.

The SOI insulating film 120 is a film in which a silicon insulating film formed on the second semiconductor wafer (bare wafer) 100b having no patterns is combined with an insulating film formed on the surface of the first semiconductor wafer 100a. The silicon oxide film may be formed by processing an undoped silicon oxide film using CVD or by thermally oxidizing the first and second semiconductor wafers 100a and 100b. In this case, the SOI insulating film 120 is formed to a sufficient thickness so as provide for electrical insulation between the lower substrate silicon 100b and an active region of the upper first semiconductor wafer 100a, which is an important element for forming an SOI structure.

As a result, in the SOI wafer according to the present invention, the active region is stably and electrically insulated in a lower region of the device as well as in a lateral direction.

Figure 2:
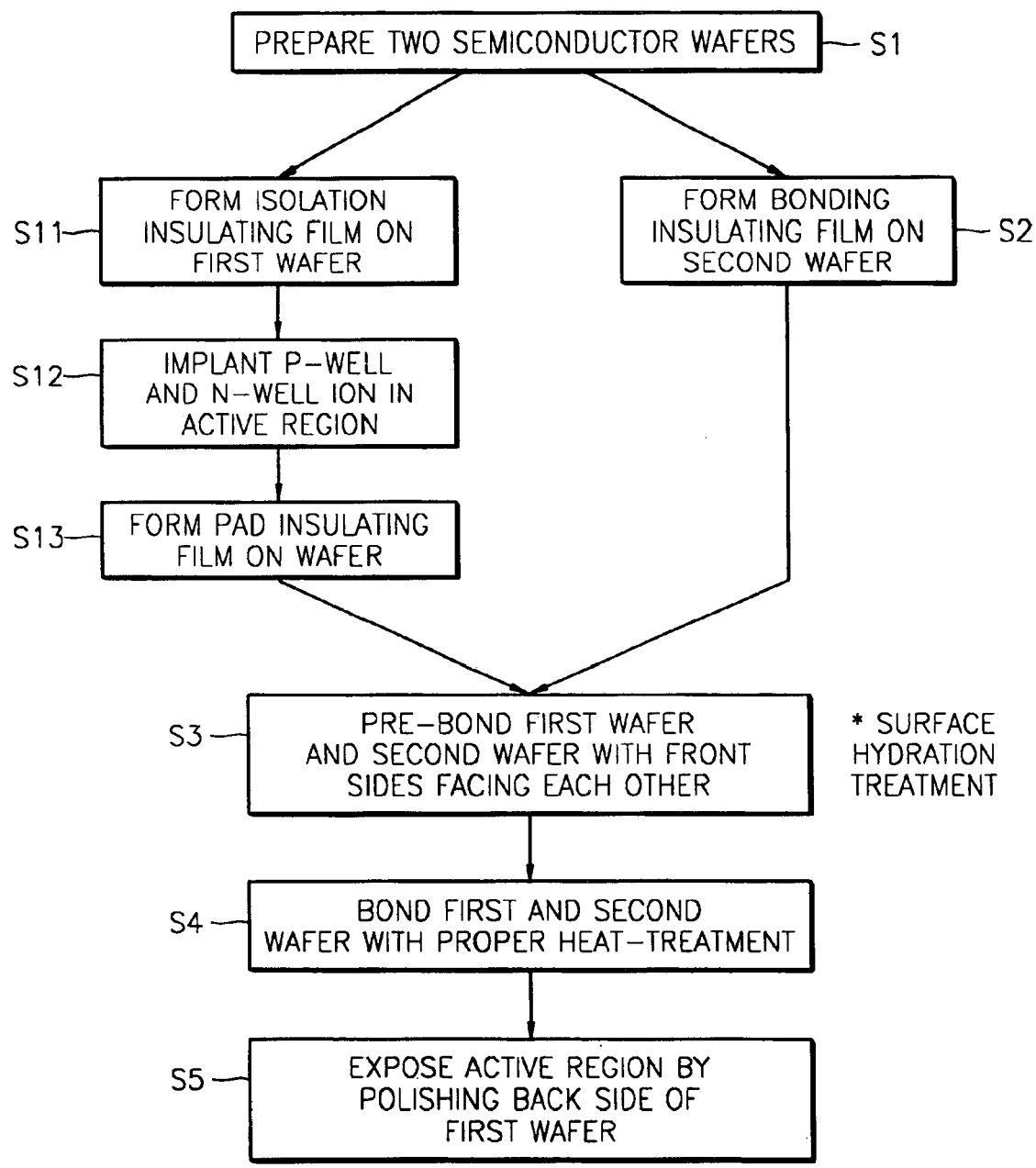
FIG. 2 is a flowchart schematically illustrating a method of manufacturing the SOI wafer according to the present invention.

FIG. 2 is a flow diagram schematically illustrating a method of manufacturing the SOI wafer according to the present invention, and FIGS. 3 through 10 sequentially illustrate the method of manufacturing the SOI wafer according to the present invention. FIG. 2 will be described with reference to FIGS. 3 through 10.

Figure 3:
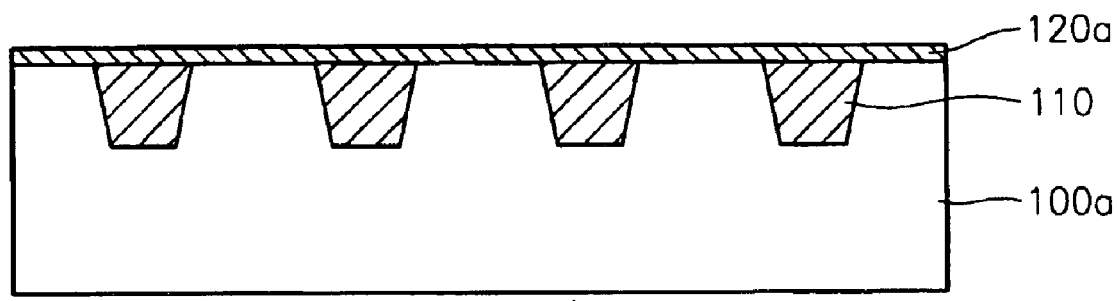
FIGS. 3 through 10 sequentially illustrate the method of manufacturing the SOI wafer according to the present invention.

Referring to FIG. 3, in step S1, a first semiconductor wafer 100a and a second semiconductor wafer 100b are prepared. In step S11, an isolation insulating film 110 is formed on the first semiconductor wafer 100a in which a device is to be formed.

First, a mask insulating film (not shown), for example comprising silicon oxide or silicon nitride, is formed on the first semiconductor wafer 100a, and a photoresist (not shown) in which a trench pattern is formed is formed on the mask insulating film using a predetermined photolithography process. The trench pattern is formed using a dry etch process on the mask insulating film and the first semiconductor wafer 100*a* using the patterned photoresist as a mask, so as to form a trench. Then, the photoresist is removed using a predetermined cleaning process. Next, a trench fill insulating film (i.e., the isolation insulating film 110), for example, comprising silicon oxide, is formed on the first semiconductor wafer 100*a* in which the trench is formed. Next, the trench fill insulating film is removed to an upper level of the mask insulating film using a chemical mechanical polishing (CMP) process such that the trench fill insulating film remains only in the trench, the isolation insulating film 110 is formed, and an active region is defined. Next, a pad insulting film 120*a* is formed on the substrate silicon of the active region. The pad insulating film 120*a* may, for example, comprise silicon oxide film formed using thermal oxidation. The silicon oxide film serves to prevent ions implanted in the substrate silicon from diffusing during the ion implantation process, in order to reduce damage to the surface of the silicon that occurs during the ion implantation process, or in order to prevent metal ions from becoming doped during the ion implantation process.

Figure 4:
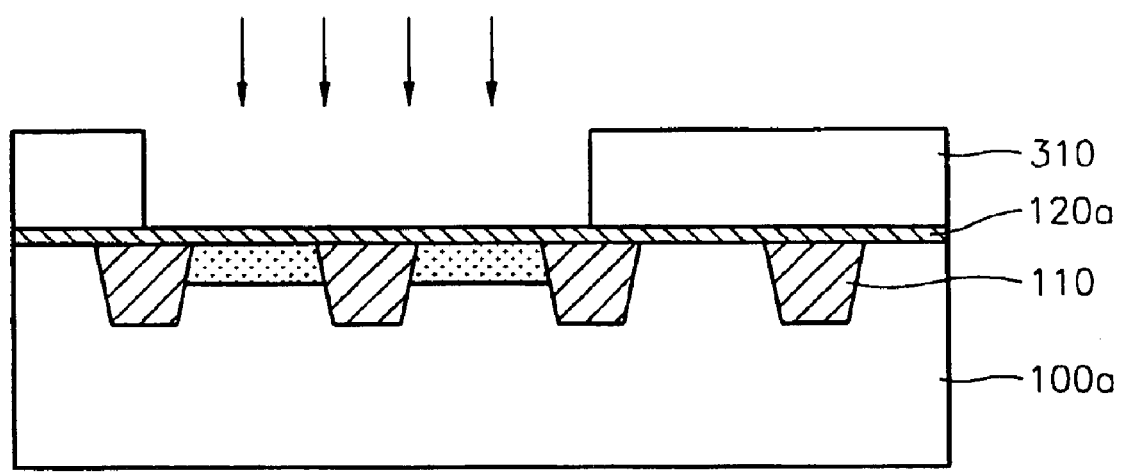
Figure 5:
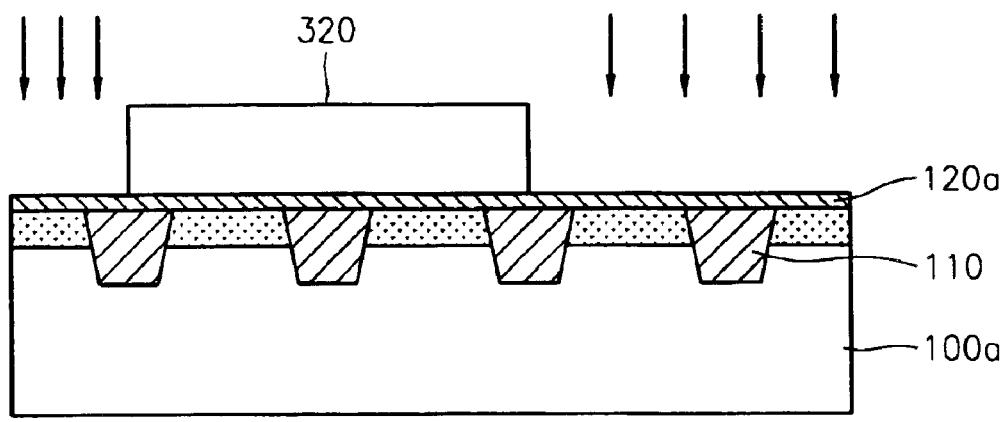

Referring to FIGS. 4 and 5, in step S12, an ion implantation process for forming an N-well, a P-well, and buried layers are performed on the first semiconductor wafer 100*a*.

Referring to FIG. 4, a photoresist 310 having a pattern with an open region for the formation of an N-well (101*b* of FIG. 1) is formed on the surface of the first semiconductor wafer 100*a* using a photolithography process. Using ion implantation, N-type impurities are implanted into the open portion of the active region using the patterned photoresist 310 as a mask. The photoresist 310 is removed using a cleaning process. For example, one of phosphorous (P), arsenic (As), and antimony (Sb) having a valence electron number of 5 or a plurality of combinations thereof may be used as the N-type impurities.

Referring to FIG. 5, photoresist 320 having a pattern for an open region for the formation of a P-well (101*a* of FIG. 1) is formed on the first semiconductor wafer 100*a* using the photolithography process. P-type impurities are implanted in the open portions of the active regions using ion implantation. The photoresist 320 is removed using a cleaning process. Boron (B) or $BF_2$, having a valence electron number of 3, may be used, for example, as the P-type impurities.

Meanwhile, in the ion implantation process shown in FIGS. 4 and 5, the order of implantation of N-type impurity ions and P-type impurity ions may be reversed.

Subsequently, in step S13, the pad insulating film 120*a* remaining on the surface of the active region is removed using a wet etch process, and then a pad insulating film 120*a* (it will be mentioned below) is formed on the wafer. In this case, the pad insulating film 120*a* is bonded with a bonding insulating film 120*b* of the second semiconductor wafer 100*b* during a subsequent bonding process to become an SOI insulating film (120 of FIG. 1).

Figure 6:
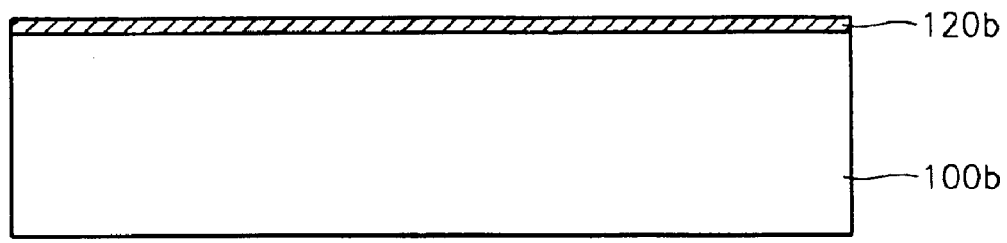

Referring to FIG. 6, in step S2, a bonding insulating film 120*b* is formed on the second semiconductor wafer 100*b*. In this case, preferably, the bonding insulating film 120*b* comprises a silicon oxide film that it is easily bonded and has a high adhesive force during a subsequent semiconductor wafer bonding process. The bonding insulating film 120*b* may be formed, for example, using CVD or using thermal oxidation. In this case, the bonding insulating film 120*b* serves as an electrical insulating film in the bulk region and thus is formed to be of a sufficient thickness so as to withstand a high applied voltage in accordance with device characteristics. Preferably, in general, the bonding insulating film 120*b* is several thousand angstroms Å in depth.

Figure 7:
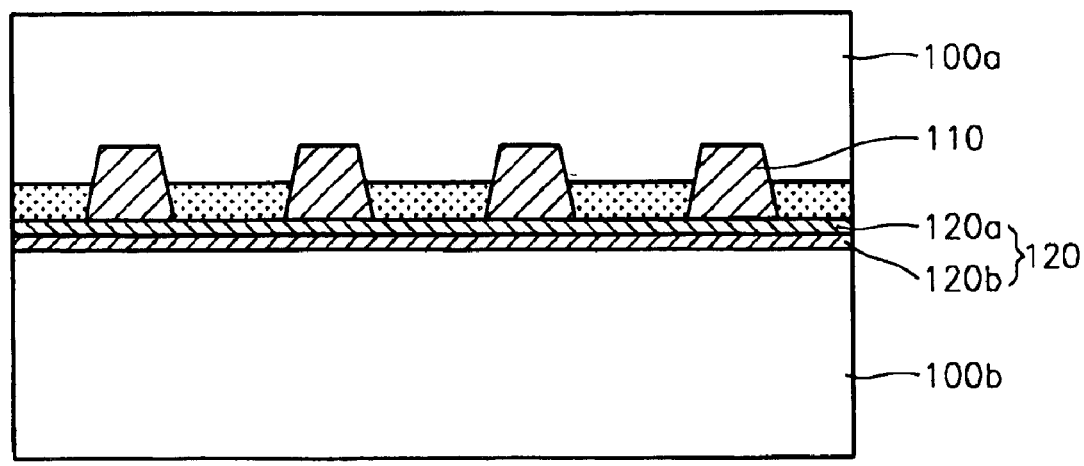

Referring to FIG. 7, in step S3, the first semiconductor wafer 100*a* and the second semiconductor wafer 100*b* with front sides facing each other are pre-bonded. That is, a hydration treatment for absorbing certain $H_2O$ vapor is performed on a surface on which the first and second semiconductor wafers 100*a* and 100*b* are bonded with each other. Thus, a bonding process is easily performed. Also, front sides of the hydration-treated first and second semiconductor wafers 100*a* and 100*b* are aligned to face each other such that the pad insulating film 120*a* of the first semiconductor wafer 100*a* contacts the bonding insulating film 120*b* of the second semiconductor wafer 100*b*. Then, a force is vertically applied to a plate of a back side of the bonded surface so that the first and second semiconductor wafers 100*a* and 100*b* are pre-bonded with each other.

Figure 8:
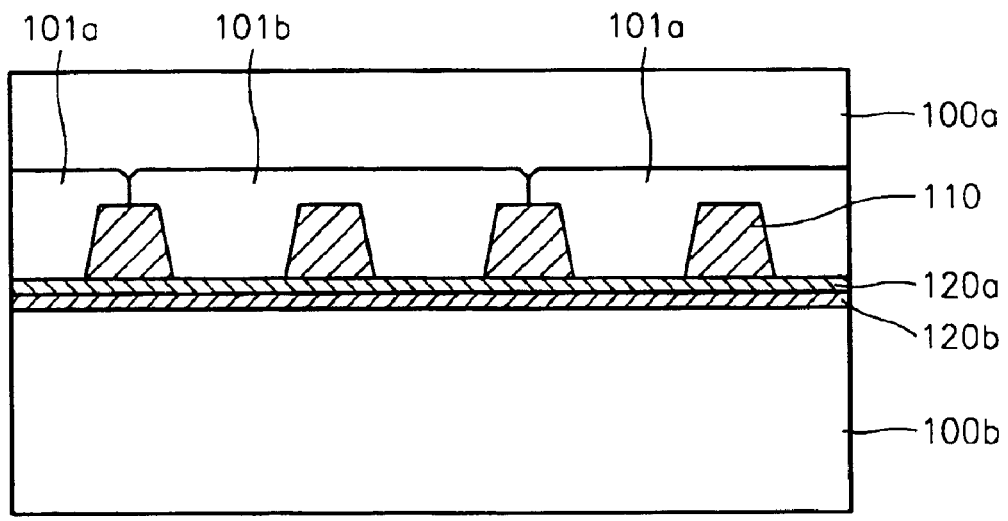

Referring to FIG. 8, in step S4, the pre-bonded first and second semiconductor wafers 100*a* and 100*b* are heat-treated for a predetermined period of time using a furnace, and the two semiconductor wafers 100*a* and 100*b* are completely bonded with each other. Assuming that the first and second semiconductor wafers 100*a* and 100*b* are heat-treated to over a predetermined temperature, silicon oxide films partially bonded at the bonded surface are not bonded with each other due to the movement of molecules. However, under the process of the present invention, the silicon oxide films are moved to vacancies, fill the vacancies, and are coupled with each other such that the first and second semiconductor wafers 100*a* and 100*b* are completely bonded with each other by bonding the bonding insulating film 120*b* and the pad insulating film 120*a*. In this case, preferably, the heating temperature is the temperature at which impurity atoms are implanted into the N-well (101*b* of FIG. 1) and P-well (101*a* of FIG. 1) regions, and buried layers, and are thus electrically activated and three-dimensionally diffused to form active regions. Accordingly, an additional well drive-in process is not necessary, thus simplifying the semiconductor manufacturing process.

Figure 9:
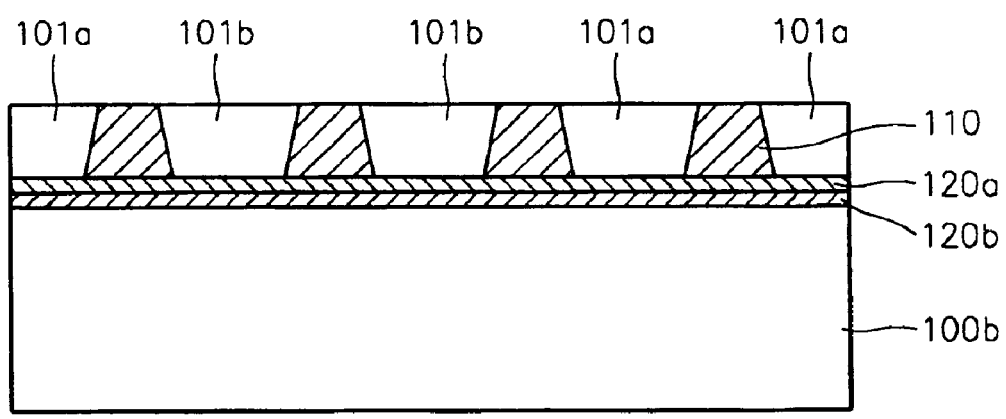

Referring to FIG. 9, in step S5, substrate silicon on the back side of the first semiconductor wafer 100*a* is planarized using a predetermined polishing process so that the active region is exposed at the back side of the first semiconductor wafer 100*a*. In this case, in the polishing process, the back side of the first semiconductor wafer 100*a* is ground using a grinder having a comparatively high polishing speed to remove the substrate silicon having a predetermined thickness, and then, the substrate silicon of the first semiconductor wafer 100*a* is planarized using CVD to the bottom level of the isolation insulating film 110 so that the back side of the active region is exposed. In this case, the isolation insulating film 110 formed of a silicon oxide film is used as a polishing stopper for the polishing process. As a result, the substrate silicon can be precisely planarized during the polishing process.

Figure 10:
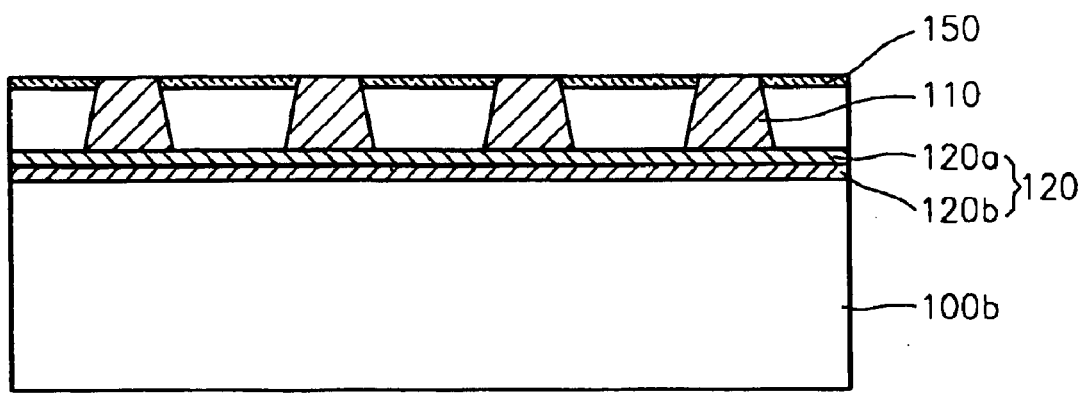

Referring to FIG. 10, a sacrificial oxide film 150 for surface planarization is formed on the surface of the first semiconductor wafer 100*a* in which the back side of the active region is exposed using the polishing process. The sacrificial oxide film 150 absorbs all defects formed on the surface of the substrate silicon during the polishing process and converts the defects into oxide films. As well, an inflexed surface is planarized, thereby improving planarity of silicon. This sacrificial oxide film 150 may serve as a protection insulating film 150 which protects the surface of the substrate silicon from contamination by impurities in a peripheral environment when in a long-term standby state during the semiconductor device manufacturing process.

Meanwhile, after the sacrificial oxide film 150 is completely removed using a wet etch process, a silicon insulating film is additionally formed using thermal oxidation and is CVD, thereby forming a more complete protection insulating film 150.

As described above, in the SOI wafer and the method of manufacturing the same according to the present invention, when the SOI wafer is manufactured, the isolation insulating film 110 is formed to define the active region, and the N-well 101a, the P-well 101b, and the buried layers are formed using a predetermined ion implantation process, thereby greatly reducing the number of processes, such as a formation process and a well drive-in process, when the semiconductor device is manufactured.

When a well is formed on a conventional SOI wafer, impurities for forming the well are implanted in an upper silicon layer using an ion implantation process, and the silicon layer is heat-treated. Since the thickness of the upper silicon layer is relatively thin, it is difficult to precisely perform the ion implantation process. Since diffusion of ions are intercepted by the lower SOI insulating film, the concentration of the well cannot be easily adjusted, and it is therefore difficult to adjust the characteristics of the resulting semiconductor device. However, in the SOI wafer according to the present invention, since the wells 101a and 101b with a uniform concentration have been formed in advance on the SOI wafer, the electrical characteristics of the semiconductor device can be precisely adjusted.

Meanwhile, in the method of manufacturing the SOI wafer according to the present invention, the well ion implantation process is performed in advance, and then the isolation insulating film is formed, thereby defining an active region.

In addition, following the well ion implantation process, the pad insulating film 120a may be used by leaving the initially-formed pad oxide film 120a or may be formed to be thicker using an additional process of forming an oxide film.

In the SOI wafer and the method of manufacturing the same according to the present invention, an SOI wafer in which the active region and the well are formed can be provided. As a result, costs can be greatly reduced when the semiconductor device is manufactured.

In addition, in the SOI wafer according to the present invention, since the well has been formed and manufactured in advance, the well is formed with a uniform concentration, and thus the electrical characteristics of the semiconductor device can be precisely regulated, thereby improving product reliability.

While this invention has been particularly shown and described with reference to preferred embodiments thereof, it will be understood by those skilled in the art that various changes in form and details may be made herein without departing from the spirit and scope of the invention as defined by the appended claims.

What is claimed is:

1. A method of manufacturing an SOI wafer, the method comprising:
   a) forming an isolation insulating film on a front face of a first semiconductor wafer to define an active region and forming a bonding insulating film on a front face of a second semiconductor wafer;
   b) forming a pad insulating film on the front face of the first semiconductor wafer;
   c) after forming the pad insulating film, performing an ion implantation process so as to form a P-well and an N-well in the active region;
   d) pre-bonding the respective front faces of the first semiconductor wafer including the active region having the P-well and the N-well, and the pad insulating film, and the second semiconductor wafer;
   e) heating the bonded first and second semiconductor wafers at a predetermined temperature to completely bond the first and second semiconductor wafers with each other; and
   f) polishing a back face of the first semiconductor wafer to a bottom level of the isolation insulating film.

2. The method of claim 1, wherein step a) comprises:
   forming a mask insulating film on the surface of the first semiconductor wafer;
   forming an isolation trench on the mask insulating film and the first semiconductor wafer;
   forming a trench fill insulating film so as to bury the isolation trench; and
   planarizing the trench fill insulating film to a level of the mask insulating film using a planarization process.

3. The method of claim 2, wherein the mask insulating film includes a silicon oxide film.

4. The method of claim 3, wherein the mask insulating film further includes a silicon nitride film.

5. The method of claim 2, wherein the trench fill insulating film is a silicon oxide film.

6. The method of claim 2, wherein chemical mechanical polishing (CMP) is used in the planarization process.

7. The method of claim 1, wherein in step a), the bonding insulating film is a silicon oxide film.

8. The method of claim 7, wherein the bonding insulating film is formed by thermally oxidizing the second semiconductor wafer.

9. The method of claim 1, wherein step c) comprises:
   forming a photoresist having a pattern with which a region in which the N-well is to be formed is opened, on the first semiconductor wafer;
   implanting N-type impurities in the first semiconductor wafer using ion implantation and using the patterned photoresist as a mask; and
   removing the photoresist.

10. The method of claim 1, wherein step c) comprises:
    forming a photoresist having a pattern with which a region in which the P-well is to be formed is opened, on the first semiconductor wafer;
    implanting P-type impurities in the first semiconductor wafer using ion implantation and using the patterned photoresist as a mask; and
    removing the photoresist.

11. The method of claim 9, wherein the N-type impurities are 5-valence electron ions, including phosphorus (P), arsenic (As), and antimony (Sb).

12. The method of claim 10, wherein the P-type impurities are 3-valence electron ions, including boron (B) and $BF_2$.

13. The method of claim 1, wherein step d) comprises:
    arranging the first and second semiconductor wafers so that their respective front faces are adjacent each other; and
    vertically applying a force to a back face of a bonded surface of the first and second semiconductor wafers.

14. The method of claim 13, wherein step d) further comprises absorbing certain $H_2O$ vapor into the surfaces at which the first and second semiconductor wafers are bonded with each other.

15. The method of claim 1, wherein step e) is performed at a temperature higher than a temperature at which ions implanted in the N-well and the P-well form a well.

16. The method of claim 1, wherein step f) comprises:
preparing a back face of the first semiconductor wafer to be a polishing face; and
polishing the back face of the first semiconductor wafer using a polishing process.

17. The method of claim 16, wherein polishing comprises grinding the back face of the first semiconductor wafer using a grinder.

18. The method of claim 16, wherein chemical mechanical polishing (CMP) is used as the polishing process.

19. The method of claim 18, wherein in the polishing process, the isolation insulating film is used as a polishing stopper.

20. The method of claim 1, after step f), further comprising forming a sacrificial oxide film on the polished back face of the first semiconductor wafer.

21. The method of claim 20, wherein the sacrificial oxide film is a silicon oxide film.

22. The method of claim 20, further comprising:
removing the sacrificial oxide film using a wet etch process; and
forming a silicon insulating film using thermal oxidation and CVD on the polished back face of the first semiconductor wafer, thereby forming a protection insulating film on the back face.

* * * * *